(12) United States Patent
Claracq et al.

(10) Patent No.: US 9,148,969 B2
(45) Date of Patent: *Sep. 29, 2015

(54) METHOD OF MANUFACTURING HIGH ASPECT RATIO SILVER NANOWIRES

(71) Applicant: Rohm and Haas Electronic Materials LLC, Marlborough, MA (US)

(72) Inventors: Jerome Claracq, Oostakker (BE); Garo Khanarian, Princeton, NJ (US); Lujia Bu, Southborough, MA (US); Jaebum Joo, Somerville, MA (US); Peter Trefonas, Medway, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 263 days.

This patent is subject to a terminal disclaimer.

(21) Appl. No.: 13/947,266

(22) Filed: Jul. 22, 2013

(65) Prior Publication Data

US 2014/0027954 A1 Jan. 30, 2014

Related U.S. Application Data

(60) Provisional application No. 61/677,211, filed on Jul. 30, 2012.

(51) Int. Cl.

| | | |
|---|---|---|
| *D01D 10/02* | (2006.01) | |
| *H05K 7/00* | (2006.01) | |
| *B82Y 30/00* | (2011.01) | |
| *B22F 1/00* | (2006.01) | |
| *B22F 9/02* | (2006.01) | |
| *C30B 29/60* | (2006.01) | |
| *D01D 5/00* | (2006.01) | |
| *D01D 5/34* | (2006.01) | |
| *D01F 1/09* | (2006.01) | |
| *H01L 31/0224* | (2006.01) | |
| *C30B 29/02* | (2006.01) | |
| *B82Y 40/00* | (2011.01) | |

(52) U.S. Cl.
CPC .............. *H05K 7/00* (2013.01); *B22F 1/0025* (2013.01); *B22F 1/0062* (2013.01); *B22F 9/02* (2013.01); *B82Y 30/00* (2013.01); *C30B 29/02* (2013.01); *C30B 29/60* (2013.01); *D01D 5/0007* (2013.01); *D01D 5/34* (2013.01); *D01F 1/09* (2013.01); *H01L 31/022466* (2013.01); *B82Y 40/00* (2013.01)

(58) Field of Classification Search
CPC ... D01D 5/003; D01D 5/0038; D01D 5/0046; D01D 5/28; D01D 5/30; D01D 5/34; D01D 10/02

USPC ......... 264/10, 172.15, 211.17, 234, 464, 465, 264/466, 484, 492, 494; 75/330, 343, 370

See application file for complete search history.

(56) References Cited

U.S. PATENT DOCUMENTS

| | | | |
|---|---|---|---|
| 9,040,114 B2 * | 5/2015 | Khanarian et al. ............ 427/125 |
| 2010/0078197 A1 | 4/2010 | Miyagishima et al. | |

OTHER PUBLICATIONS

Bognitzki, et al., Preparation of Sub-micrometer Copper Fivers via Electrospinning, Advanced Materials, vol. 18, pp. 2384-2386 (2006).
Wu, et al., Electrospun Metal Nanofiber Webs as High-Performance Transparent Electrode, Nano Letters, vol. 10, pp. 4242-4248 (2010).
Qing, et al., Silver Nanoparticles Filling in TiO2 Hollow Nanofibers by Coaxial Electrospinning, Acta Phys.-Chim. Sin., vol. 24, No. 10, pp. 1790-1796 (2008).
Pol, et al., Fabrication of Continuous Conducting Gold Wires by Electrospinning, Chem. Mater., vol. 20, No. 9, pp. 3055-3062 (2008).
çinar, et al., Synthesis of Silver Nanoparticles by Oleylamine-Oleic Acid Reduction and Its Use in Making Nanocable by Coaxial Electrospinning, Journal of Nanoscience and Nanotechnology, vol. 11, pp. 3669-3679 (2011).
Mdluli, et al., An improved N,N-dimethylformamide and polyvinyl pyrrolidone approach for the synthesis of long silver nanowires, Journal of Alloys and Compounds, 469, pp. 519-522 (2009).
Walther, et al., Structure-Tunable Bidirectional Hybrid Nanowires via Multicompartment Cylinders, NANO Letters, vol. 9, No. 5, pp. 2026-2030 (2009).
Giersig, et al., Evidence of an aggregative mechanism during the formation of silver nanowires in N,N-dimethylformamide, Journal of Materials Chemistry, vol. 14, pp. 607-610 (2004).
He, et al., Synthesis and characterization of silver nanowires with zigzag morphology in N,N-dimethylformamide, Journal of Solid State Chemistry, 180, pp. 2262-2267 (2007).

* cited by examiner

*Primary Examiner* — Leo B Tentoni
(74) *Attorney, Agent, or Firm* — Thomas S. Deibert

(57) ABSTRACT

A process for manufacturing silver nanowires is provided, comprising: providing a silver ink core component containing ≥60 wt % silver nanoparticles dispersed in a silver carrier; providing a shell component containing a film forming polymer dispersed in a shell carrier; providing a substrate; coelectrospinning the silver ink core component and the shell component depositing on the substrate a core shell fiber having a core and a shell surrounding the core, wherein the silver nanoparticles are in the core; and, treating the silver nanoparticles to form a population of silver nanowires, wherein the population of silver nanowires exhibit an average length, L, of ≥60 μm.

10 Claims, No Drawings

METHOD OF MANUFACTURING HIGH ASPECT RATIO SILVER NANOWIRES

This application claims priority to U.S. Provisional Application No. 61/677,211 filed on Jul. 30, 2012.

The present invention relates generally to the field of manufacture of silver nanowires. In particular, the present invention is directed to a method of manufacturing silver nanowires exhibiting high lengths (preferably ≥60 μm) for use in various applications.

Films that exhibit a high conductivity in combination with a high transparency are of great value for use as electrodes or coatings in a wide range of electronic applications, including, for example, touch screen displays and photovoltaic cells. Current technology for these applications involves the use of a tin doped indium oxide (ITO) containing films that are deposited through physical vapor deposition methods. The high capital cost of physical vapor deposition processes has led to the desire to find alternative transparent conductive materials and coating approaches. The use of silver nanowires dispersed as a percolating network has emerged as a promising alternative to ITO containing films. The use of silver nanowires potentially offer the advantage of being processable using roll to roll techniques. Hence, silver nanowires offer the advantage of low cost manufacturing with the potential of providing higher transparency and conductivity than conventional ITO containing films.

The "polyol process" has been disclosed for the manufacture of silver nanostructures. The polyol process uses ethylene glycol (or an alternative glycol) as both a solvent and a reducing agent in the production of silver nanowires. The use of glycols; however, has several inherent disadvantages. Specifically, using glycol as both the reducing agent and the solvent results in a decrease in control over the reaction as the principal reducing agent species (glycolaldehyde) is produced in situ and its presence and concentration are dependent on the extent of exposure to oxygen. Also, the use of glycol introduces the potential for the formation of combustible glycol/air mixtures in the headspace of the reactor used to produce the silver nanowires. Finally, the use of large volumes of glycol create disposal concerns, increasing the cost of commercializing such operations.

One alternative approach to the polyol process for manufacturing silver nanowires has been disclosed by Miyagishima, et al. in United States Patent Application Publication No. 20100078197. Miyagishima, et al. disclose a method for producing metal nanowires, comprising: adding a solution of a metal complex to a water solvent containing at least a halide and a reducing agent, and heating a resultant mixture at 150° C. or lower, wherein the metal nanowires comprise metal nanowires having a diameter of 50 nm or less and a major axis length of 5 μm.

Notwithstanding, there remains a need for alternative silver nanowire manufacturing methods. In particular, for methods of manufacturing silver nanowires without the use of glycol, wherein the silver nanowires produced exhibit high lengths (preferably ≥60 μm).

The present invention provides a process for manufacturing silver nanowires, comprising: providing a silver ink core component containing ≥60 wt % silver nanoparticles dispersed in a silver carrier; providing a shell component containing a film forming polymer dispersed in a shell carrier; providing a substrate; coelectrospinning the silver ink core component and the shell component depositing on the substrate a core shell fiber having a core and a shell surrounding the core, wherein the silver nanoparticles are in the core; and, treating the silver nanoparticles to form a population of silver nanowires, wherein the population of silver nanowires exhibit an average length, L, of ≥60 μm.

The present invention provides a process for manufacturing silver nanowires, comprising: providing a silver ink core component containing ≥60 wt % silver nanoparticles dispersed in a silver carrier; providing a shell component containing a film forming polymer dispersed in a shell carrier; wherein the silver carrier and the shell carrier are selected such that the interfacial tension between the shell component and the silver ink core component is 2 to 5 mN/m; providing a substrate; coelectrospinning the silver ink core component and the shell component depositing on the substrate a core shell fiber having a core and a shell surrounding the core, wherein the silver nanoparticles are in the core; and, treating the silver nanoparticles to form a population of silver nanowires, wherein the population of silver nanowires exhibit an average length, L, of ≥60 μm.

DETAILED DESCRIPTION

A process for manufacturing silver nanowires having an average length, L, of ≥60 μm, while avoiding the inherent disadvantages associated with the use of glycols.

The term "high aspect ratio" as used herein and in the appended claims in reference to the recovered silver nanowires means that the average aspect ratio of the recovered silver nanowires is >150. Preferably, the recovered silver nanowires exhibit an average aspect ratio of ≥200. Most preferably, the recovered silver nanowires exhibit an average aspect ratio of ≥1,000.

Preferably, the silver ink core component used in the process for manufacturing silver nanowires of the present invention comprises ≥60 wt % (more preferably ≥70 wt %; most preferably ≥75 wt %) silver nanoparticles dispersed in a silver carrier.

Preferably, the silver nanoparticles used in the silver ink core component exhibit an aspect ratio of ≤2 (more preferably ≤1.5; most preferably ≤1.1). The silver nanoparticles used optional comprise a treatment or surface coating to facilitate the formation of a stable dispersion in the silver carrier and to inhibit the formation of agglomerates.

Silver carrier used in the process for manufacturing silver nanowires of the present invention can be selected from any liquid in which the silver nanoparticles can be dispersed. Preferably, the silver carrier is selected from the group consisting of water, alcohol and mixtures thereof. More preferably, the silver carrier is selected from the group consisting of water; $C_{1-4}$ alcohol (e.g., methanol, ethanol, propanol, isopropanol, butanol); dimethyl sulfoxide; N,N-dimethyl formamide; 1-methyl-2-pyrrolidone; trimethyl phosphate and mixtures thereof. Most preferably, the silver carrier is water.

The silver ink core component used in the process for manufacturing silver nanowires of the present invention, optionally, further comprises a core additive. Core additives can be selected from the group consisting of surfactants, antioxidants, photoacid generators, thermal acid generators, quenchers, hardeners, dissolution rate modifiers, photocuring agents, photosensitizers, acid amplifiers, plasticizers, orientation control agents, and cross linking agents. Preferred core additives include surfactants and antioxidants.

Preferably, the shell component used in the process for manufacturing silver nanowires of the present invention comprises a film forming polymer dispersed in a shell carrier.

Film forming polymer used in the process for manufacturing silver nanowires of the present invention can be selected from known electrospinnable film forming materials. Preferred film forming polymers include polyacrylic acid, polyethylene oxide, polyvinyl alcohol, polyvinyl propylene, cellulose (e.g., hydroxy propyl cellulose, nitrocellulose), silk and blends thereof. More preferably, the film forming polymer is polyethylene oxide. Most preferably, the film forming polymer is polyethylene oxide having a weight average molecular weight of 10,000 to 1,000,000 g/mol.

Shell carrier used in the process for manufacturing silver nanowires of the present invention can be selected from any liquid in which the film forming polymer is dispersible. Preferably, the shell carrier can be any good solvent for the film forming polymer. More preferably, the shell carrier is selected such that the interfacial tension between the shell component and the silver ink core component is >0.1 mN/m (preferably, >1 mN/m; more preferably, >2 mN/m; most preferably 2 to 5 mN/m). When used in combination with a silver ink core component having water as the silver carrier, the shell carrier is preferably selected from the group consisting of a water alcohol mixture; wherein the alcohol is selected from the group consisting of acetone, $C_{1-4}$ alcohols (e.g., methanol, ethanol, isopropanol, propanol, butanol, tert-butanol) and mixtures thereof; and wherein the water alcohol mixture exhibits an alcohol concentration of ≥50 wt % (more preferably >50 wt %).

The shell component used in the process for manufacturing silver nanowires of the present invention, optionally, further comprises a shell additive. Shell additives can be selected from the group consisting of surfactants, antioxidants, photoacid generators, thermal acid generators, quenchers, hardeners, dissolution rate modifiers, photocuring agents, photosensitizers, acid amplifiers, plasticizers, orientation control agents, and cross linking agents. Preferred shell additives include surfactants and antioxidants.

A particularly preferred shell component used in the process for manufacturing silver nanowires of the present invention, comprises 1 to 25 wt % (more preferably 1 to 15 wt %; most preferably 2 to 10 wt %) film forming polymer dispersed in a water and $C_{1-4}$ alcohol mixture shell carrier. Preferably, the shell carrier is a water and $C_{1-4}$ alcohol mixture having an alcohol concentration ≥50 wt % (most preferably ≥60 wt % alcohol). Most preferably, the shell component comprises 2 to 10 wt % polyethylene oxide in a shell carrier, wherein the shell carrier is a water ethanol mixture having an ethanol content of ≥50 wt %.

Substrate used in the process for manufacturing silver nanowires of the present invention can be selected from any known substrates both conductive and nonconductive. Preferred substrates include glass (e.g., Willow® glass available from Corning, Inc.), plastic film (e.g., polyethylene, polyethylene terephthalate, polycarbonate, poly methyl methacrylate), metals (e.g., aluminum, copper), conductive treated papers, conductive treated nonwoven fabrics, conductive liquid baths (e.g., water, water electrolyte mixtures). Preferably, the substrate used in the process for manufacturing silver nanowires of the present invention is selected for later incorporation into a device (e.g., as part of a transparent conductor assembly in a touch screen device). Preferably, the substrate used in the process for manufacturing silver nanowires of the present invention is selected to facilitate subsequent processing of the silver nanowires deposited thereon (e.g., to facilitate recovery/separation of the nanowires from the substrate).

Preferably, the process for manufacturing silver nanowires of the present invention, comprises: providing a silver ink core component containing ≥60 wt % (more preferably ≥70 wt %; most preferably ≥75 wt %) silver nanoparticles dispersed in a silver carrier; providing a shell component containing a film forming polymer dispersed in a shell carrier; providing a substrate; coelectrospinning the silver ink core component and the shell component depositing on the substrate a core shell fiber having a core and a shell surrounding the core, wherein the silver nanoparticles are in the core; and, treating the silver nanoparticles to form a population of silver nanowires, wherein the population of silver nanowires exhibit an average length, L, of ≥60 μm (preferably 60 to 10,000 μm; more preferably 100 to 10,000 μm; most preferably 500 to 10,000 μm).

Preferably, the process for manufacturing silver nanowires of the present invention, comprises: providing a silver ink core component containing ≥60 wt % (more preferably ≥70 wt %; most preferably ≥75 wt %) silver nanoparticles dispersed in a silver carrier; providing a shell component containing a film forming polymer dispersed in a shell carrier; providing a substrate; coelectrospinning the silver ink core component and the shell component depositing on the substrate a core shell fiber having a core and a shell surrounding the core, wherein the silver nanoparticles are in the core; and, treating the silver nanoparticles to form a population of silver nanowires, wherein the population of silver nanowires exhibit an average diameter, D, of ≤5 μm (preferably 100 nm to 5 μm; more preferably 1 to 5 μm) and an average length, L, of ≥60 μm (preferably 60 to 10,000 μm; more preferably 100 to 10,000 μm; most preferably 500 to 10,000 μm 500 to 10,000 μm (preferably, wherein the aspect ratio, L/D, of the silver nanowires is ≥150 (more preferably ≥200; still more preferably ≥500; most preferably ≥1,000).

Preferably, in the process for manufacturing silver nanowires of the present invention, the core shell fiber is deposited on the substrate in an overlapping pattern selected from the group consisting of a random overlapping pattern and a controlled overlapping pattern, wherein the population of silver nanowires forms a conductive network. Preferably, the conductive network formed exhibits a sheet resistance, $R_s$, of <100 Ω/sq.

In the process for manufacturing silver nanowires of the present invention, the silver nanoparticles in the core shell fiber deposited on the substrate are treated using a technique selected from the group consisting of sintering (e.g., photosintering, thermal sintering); heating (e.g., burn-off, micro pulse photonic heating, continuous photonic heating, microwave heating, oven heating, furnace heating) and a combination thereof. Preferably, the silver nanoparticles in the core shell fiber deposited on the substrate are treated by photosintering.

Preferably, the process for manufacturing silver nanowires of the present invention, coelectrospinning comprises feeding the silver ink core component and the shell component through a coannular nozzle having a central opening and a surrounding annular opening, wherein the silver ink core component is fed through the central opening and the shell component is fed through the surrounding annular opening. Preferably, the ratio of the volumetric flow rate of the shell material, $VFR_{shell}$, fed through the surrounding annular opening to the volumetric flow rate of the core material, $VFR_{core}$, fed through the central opening is greater than or equal to the ratio of the cross sectional area of the surrounding annular opening perpendicular to the direction of flow, $CSA_{annular}$, to the cross sectional area of the central opening perpendicular to the direction of flow, $CSA_{center}$. More preferably, the following expression is satisfied by the processing conditions:

$$VFR_{shell}/VFR_{core} \geq 1.2*(CSA_{annular}/CSA_{center}).$$

Most preferably, the following expression is satisfied by the processing conditions:

$$VFR_{shell}/VFR_{core} \geq 1.4*(CSA_{annular}/CSA_{center}).$$

Preferably, in the process for manufacturing silver nanowires of the present invention, the silver ink core component is fed through the central opening at a volumetric flow rate of 0.1 to 3 µL/min (preferably 0.1 to 1 µL/min; more preferably 0.1 to 0.7 µL/min; most preferably 0.4 to 0.6 µL/min).

Preferably, in the process for manufacturing silver nanowires of the present invention, the shell component is fed through the surrounding annular opening at a flow of 1 to 30 µL/min (preferably 1 to 10 µL/min; more preferably 1 to 7 µL/min; most preferably 4 to 6 µL/min).

Preferably, in the process for manufacturing silver nanowires of the present invention, the coannular nozzle is set at an applied positive difference of electric potential relative to the substrate. More preferably, wherein the applied electric potential difference is 5 to 50 kV (preferably, 5 to 30 kV; more preferably, 5 to 25 kV; most preferably, 5 to 10 kV).

Some embodiments of the present invention will now be described in detail in the following Examples.

A dual nozzle electrospinning machine Model EC-DIG from IME Technologies was used to electrospin silver nanowires in the Examples. The nozzle used in the Examples was a coaxial nozzle (EM-CAX from IME Technologies) having an inner opening having a circular cross section perpendicular to the direction of material flow having a 0.4 mm diameter; and, an outer opening having an annular cross section perpendicular to the direction of material flow and concentric with the inner opening; and having a 0.6 mm inner diameter and a 1.2 mm outer diameter. When spinning material, the silver ink core component was fed through the inner opening of the coaxial nozzle and the shell component was fed through the outer opening of the coaxial nozzle. The silver ink core component and the shell component were fed through the coaxial nozzle using independent syringe pumps (EP-NE1 from IME Technologies) controlling the volumetric flow rate of the silver ink core component, $VFR_{core}$, at 0.5 µL/min and the volumetric flow rate of the shell component, $VFR_{shell}$, at 5 µL/min. The electrospinning process in the Examples was performed at ambient atmospheric conditions in a climate controlled laboratory at 20° C. and relative humidity of 25-35%.

The substrate used for collecting the fibers in the Examples was a 0.16-0.19 mm thick glass slide having a 60 mm diameter. During the spinning operation, the glass plate was placed on top of a grounded electrode while the spinning head was located vertically above the substrate. A positive electric potential was applied to the spinning head during spinning. The voltage used in the Examples varied from 9 kV at the start of spinning down to 7 kV once the spinning process became stable.

Photonic sintering referred to in the Examples was performed using a Pulseforge 3100 photon generator available from Novacentrix. The photon generator was outfitted with a high intensity xenon lamp capable of emitting light over a broad spectrum from UV to short IR. The photon generator was set up at 350 V to produce 400 µsec pulses with a 5 Hz frequency on continuous mode generating 2.46 J/cm$^2$. The samples were fed through the photon generator on a conveyor belt at a rate of 7.62 m/min.

Sheet resistance values reported for the photonic sintered samples were measured according to ASTM F390-11 using a Jendel HM-20 colliner 4 point probe test unit from Jandel Engineering Limited.

The percent transmission versus wavelength measurements reported in the Examples were performed using an HP Lambda 9 UV VIS spectrometer.

Examples 1-2

Silver Nanowire Preparation by Coaxial Electrospinning

In each of Examples 1-2 silver nanowires were electrospun and deposited onto a glass slide substrate. The silver ink core component used in Examples 1-2 comprised 75 wt % silver nanoparticles with a nominal particle size of 50 nm dispersed in water (Available from Cabot Corporation as CSD-95). The shell component used in the Examples 1-2 comprised 6 wt % polyethylene oxide (400,000 g/mol from Aldrich) dissolved in a 40/60 wt % water/ethanol solution; wherein the interfacial tension between the silver ink core component and the shell component was measured to be 2-5 mN/m.

The sheet resistance of the deposited silver nanowire networks from Examples 1-2 measured before and after photonic sintering is reported in TABLE 1.

The post sintered product silver nanowire network from Example 1 was analyzed by optical microscopy and observed to exhibit silver nanowires having diameters in the 1-5 µm range and lengths in the 800-1,000 µm range.

The post sintered product silver nanowire network from Example 1 was analyzed by spectrometer and observed to exhibit a percent transmission of >70% across the visible spectrum from 390 nm to 750 nm.

TABLE 1

| Ex. # | Before Photonic Sintering (in kΩ/sq) | After Photonic Sintering (in Ω/sq) |
| --- | --- | --- |
| 1 | 360.4 ± 36.8 | 44.6 ± 4.6 |
| 2 | 431.5 ± 30.9 | 57.4 ± 2.1 |

Comparative Example A1

The silver ink core component used in Comparative Example A1 comprised 60 wt % silver nanoparticles dispersed in water (Available from PChem Associates, Inc. as PFI-722 ink). A variety of shell components were used in Comparative Example A1 including the following:

6 wt % polyacrylic acid in water;
4 wt polyethylene oxide in a 60/40 wt % ethanol/water mixture;
6 wt % polyethylene oxide in a 60/40 wt % isopropanol/water mixture;
8 wt % polyacrylic acid in a 30/20/50 wt % water/isopropanol/butanol mixture;
4-6 wt % polyethylene oxide in a 60/40 wt % ethanol/water mixture;
4-8 wt % polyacrylic acid in a 60/40 wt % ethanol/water mixture; and,
4-8 wt % polyacrylic acid in a 40/60 wt % ethanol/water mixture.

The interfacial tension between the silver ink core component and the shell component in each of these systems was measured to be 0.4-2 mN/m.

Efforts to produce silver nanowires using this silver ink core component combined with the listed shell components were all unsuccessful.

Comparative Example A2

The silver ink core component used in Comparative Example A2 comprised 60 wt % silver nanoparticles dispersed in water (Available from PChem Associates, Inc. as PFI-722 ink). A variety of shell components were used in Comparative Example A1 including the following:

6 wt % polyacrylic acid in water;

4 wt % polyethylene oxide in a 60/40 wt % ethanol/water mixture;

6 wt % polyethylene oxide in a 60/40 wt % isopropanol/water mixture;

8 wt % polyacrylic acid in a 30/20/50 wt % water/isopropanol/butanol mixture;

4-6 wt % polyethylene oxide in a 60/40 wt % ethanol/water mixture;

4-8 wt % polyacrylic acid in a 60/40 wt % ethanol/water mixture; and, 4-8 wt % polyacrylic acid in a 40/60 wt % ethanol/water mixture.

The interfacial tension between the silver ink core component and the shell component in each of these systems was measured to be 0.4-2 mN/m.

Efforts to produce silver nanowires using this silver ink core component in combination individually with each of the listed shell components by coelectrospinning process (as described above and as used in Example 1) were all unsuccessful.

We claim:

1. A process for manufacturing silver nanowires, comprising:
   providing a silver ink core component containing ≥60 wt % silver nanoparticles dispersed in a silver carrier;
   providing a shell component containing a film forming polymer dispersed in a shell carrier;
   providing a substrate;
   coelectrospinning the silver ink core component and the shell component depositing on the substrate a core shell fiber having a core and a shell surrounding the core, wherein the silver nanoparticles are in the core; and,
   treating the silver nanoparticles to form a population of silver nanowires, wherein the population of silver nanowires exhibit an average length, L, of ≥60 µm.

2. The process of claim 1, wherein the silver carrier and the shell carrier are selected such that the interfacial tension between the shell component and the silver ink core component is 2 to 5 mN/m.

3. The process of claim 2, wherein the core shell fiber is deposited on the substrate in an overlapping pattern selected from the group consisting of a random overlapping pattern and a controlled overlapping pattern, wherein the population of silver nanowires forms a conductive network.

4. The process of claim 2, wherein the silver nanoparticles are treated by photosintering.

5. The process of claim 2, wherein the coelectrospinning comprises feeding the the silver ink core component and the shell component through a coannular nozzle having a central opening and a surrounding annular opening, wherein the silver ink core component is feed through the central opening and the shell component is feed through the surrounding annular opening.

6. The process of claim 2, wherein the silver nanoparticles exhibit an aspect ratio (L/D) of ≤2.

7. The process of claim 2, wherein the silver carrier is water and the shell carrier is a water alcohol mixture, wherein the water alcohol mixture contains ≥50 wt % alcohol.

8. The process of claim 5, wherein the silver ink core component is fed through the central opening at a flow rate of 0.1 to 3 µL/min and the shell component is fed through the surrounding annular opening at a flow of 1 to 30 µL/min.

9. The process of claim 5, wherein the nozzle is set at an applied positive difference of electric potential relative to the substrate.

10. The process of claim 9, wherein the applied electric potential difference is 5 to 50 kV.

* * * * *